United States Patent
Emerson

(10) Patent No.: US 11,282,976 B2
(45) Date of Patent: Mar. 22, 2022

(54) SOLAR PANEL MODULE

(71) Applicant: Northrop Grumman Systems Corporation, Falls Church, VA (US)

(72) Inventor: Eric J. Emerson, Chandler, AZ (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 16/827,699

(22) Filed: Mar. 23, 2020

(65) Prior Publication Data
US 2020/0328318 A1     Oct. 15, 2020

Related U.S. Application Data

(60) Provisional application No. 62/919,692, filed on Mar. 22, 2019.

(51) Int. Cl.
| | |
|---|---|
| *H02N 6/00* | (2006.01) |
| *H01L 31/042* | (2014.01) |
| *H01L 31/05* | (2014.01) |
| *H01L 31/0443* | (2014.01) |
| *B64G 1/44* | (2006.01) |

(Continued)

(52) U.S. Cl.
CPC .......... *H01L 31/0504* (2013.01); *B64G 1/443* (2013.01); *H01L 31/02008* (2013.01); *H01L 31/0443* (2014.12); *H05K 1/118* (2013.01)

(58) Field of Classification Search
CPC .......... H05K 1/118; H05K 2201/10143; H01L 31/0443; H01L 31/0504; H01L 31/02008; H01L 31/0516; B64G 1/443
See application file for complete search history.

(56) References Cited

U.S. PATENT DOCUMENTS

| | | | |
|---|---|---|---|
| 4,812,135 A | * | 3/1989 | Smith ................ H01B 7/0838 174/117 F |
| 5,723,205 A | | 3/1998 | Millette et al. |

(Continued)

FOREIGN PATENT DOCUMENTS

WO     WO2013184244     12/2013

OTHER PUBLICATIONS

International Search Report and Written Opinion, for corresponding PCT application No. PCT/US2020/024351, dated Jun. 26, 2020 (19 pages).

*Primary Examiner* — Angelo Trivisonno
(74) *Attorney, Agent, or Firm* — Christensen, Fonder, Dardi & Herbert PLLC

(57) ABSTRACT

A solar panel module has a flexible circuit board, a matrix of solar cells surface mounted thereto, a coverglass extending over the matrix of solar cells and the flexible circuit board bonded to a rigid support panel. The circuitry including electrical connection pads in an arrangement on the first side surface for electrical connection of the circuitry to each of the matrix of solar cells, flat bypass diodes may be disposed on the first side surface under the cells and connecting to the circuitry. Conductive adhesives adhering each of the solar cells to the flex circuit at the electrical connection pads that correlate to electrical connection points on underside of each solar cells. The first side having a plurality of standoffs for receiving each of the matrix of solar cells providing raised levels for the solar cells, the landing portions projecting outwardly from a base level surface.

13 Claims, 17 Drawing Sheets

(51) Int. Cl.
*H05K 1/11* (2006.01)
*H01L 31/02* (2006.01)

(56) References Cited

U.S. PATENT DOCUMENTS

| | | | |
|---|---|---|---|
| 7,709,729 B2 * | 5/2010 | Simburger | B64G 1/222 |
| | | | 136/244 |
| 8,356,770 B2 | 1/2013 | Parks | |
| 9,214,573 B2 | 12/2015 | Shimada | |
| 9,214,892 B2 | 12/2015 | White et al. | |
| 9,728,663 B1 | 8/2017 | Tourino et al. | |
| 9,748,432 B2 | 8/2017 | Clevenger et al. | |
| 9,882,330 B2 | 1/2018 | Kalman | |
| 9,960,301 B2 | 5/2018 | Minelli | |
| 10,475,944 B2 | 11/2019 | Kim et al. | |
| 2010/0114679 A1 | 5/2010 | Pan | |
| 2010/0116325 A1 * | 5/2010 | Nikoonahad | H01L 31/0504 |
| | | | 136/251 |
| 2011/0126878 A1 | 6/2011 | Hacke et al. | |
| 2012/0103388 A1 * | 5/2012 | Meakin | B32B 17/10018 |
| | | | 136/244 |
| 2014/0102531 A1 * | 4/2014 | Moslehi | H01L 31/022458 |
| | | | 136/256 |
| 2014/0190545 A1 * | 7/2014 | Lei | H01L 31/049 |
| | | | 136/244 |
| 2017/0047886 A1 | 2/2017 | Atwater et al. | |
| 2017/0098729 A1 * | 4/2017 | Fisher | G02B 19/0042 |
| 2017/0244356 A1 | 8/2017 | Stribling | |
| 2019/0127089 A1 | 5/2019 | Tomoda et al. | |

* cited by examiner

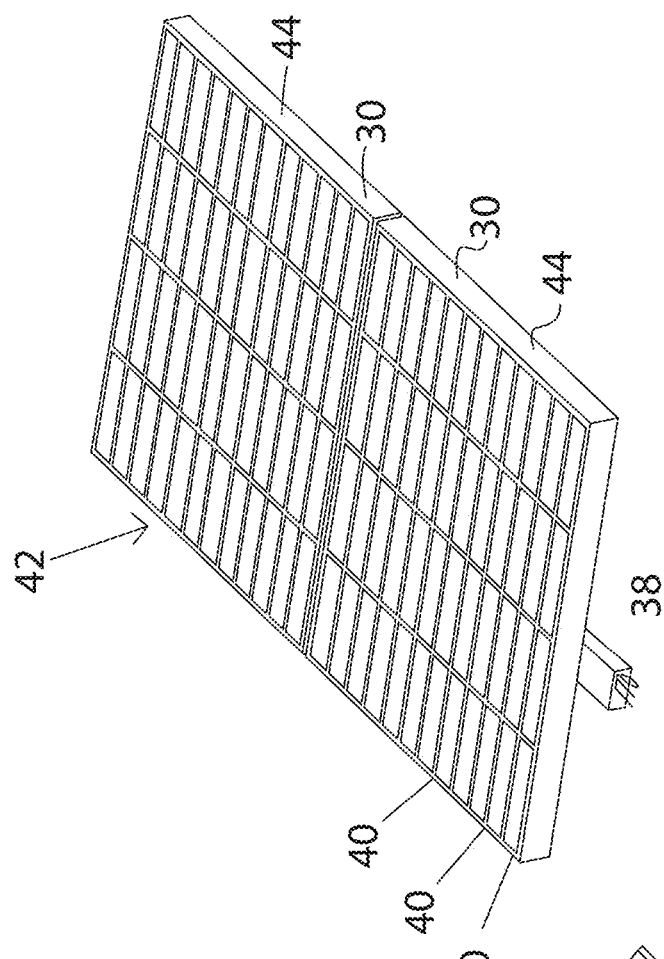
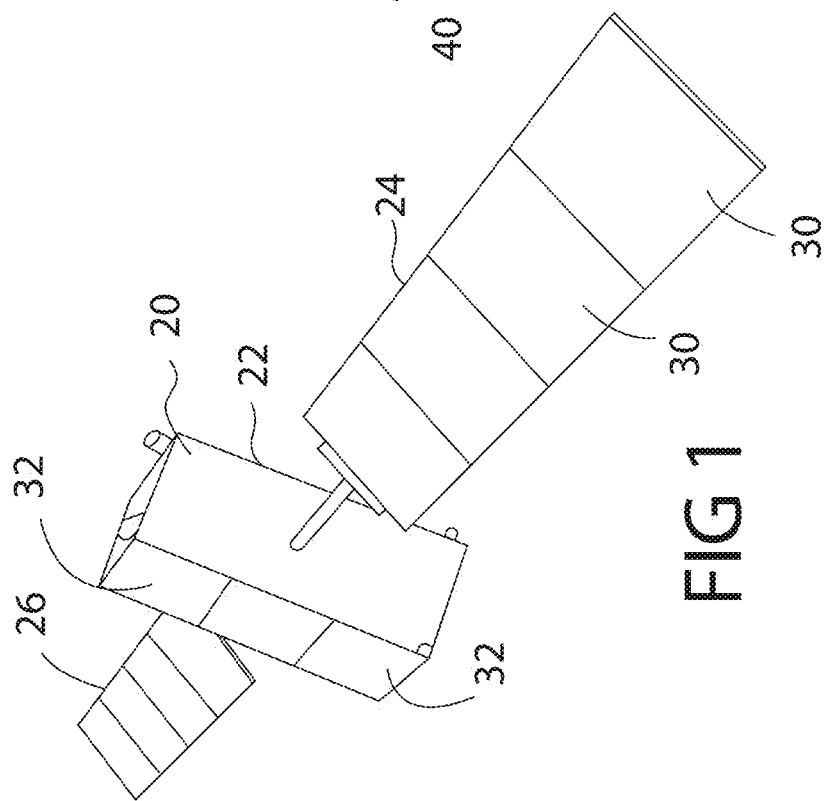

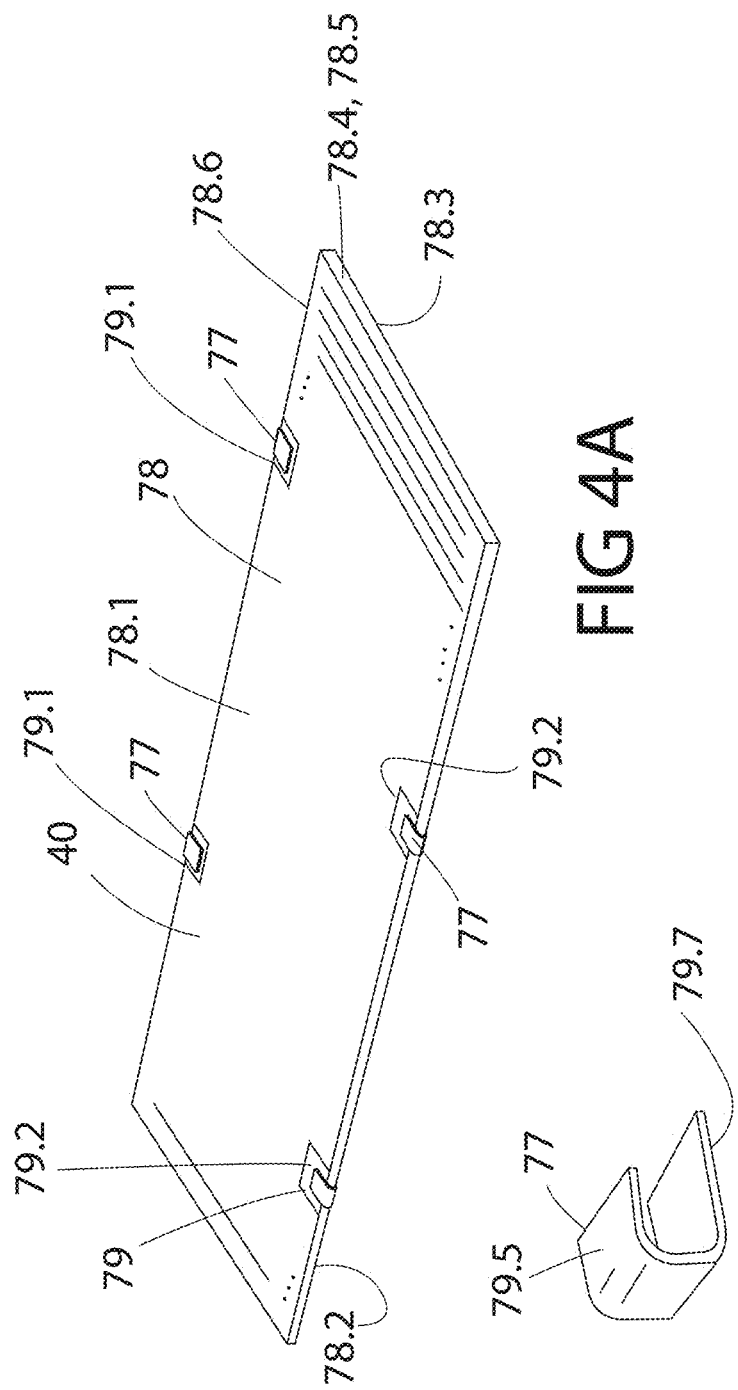

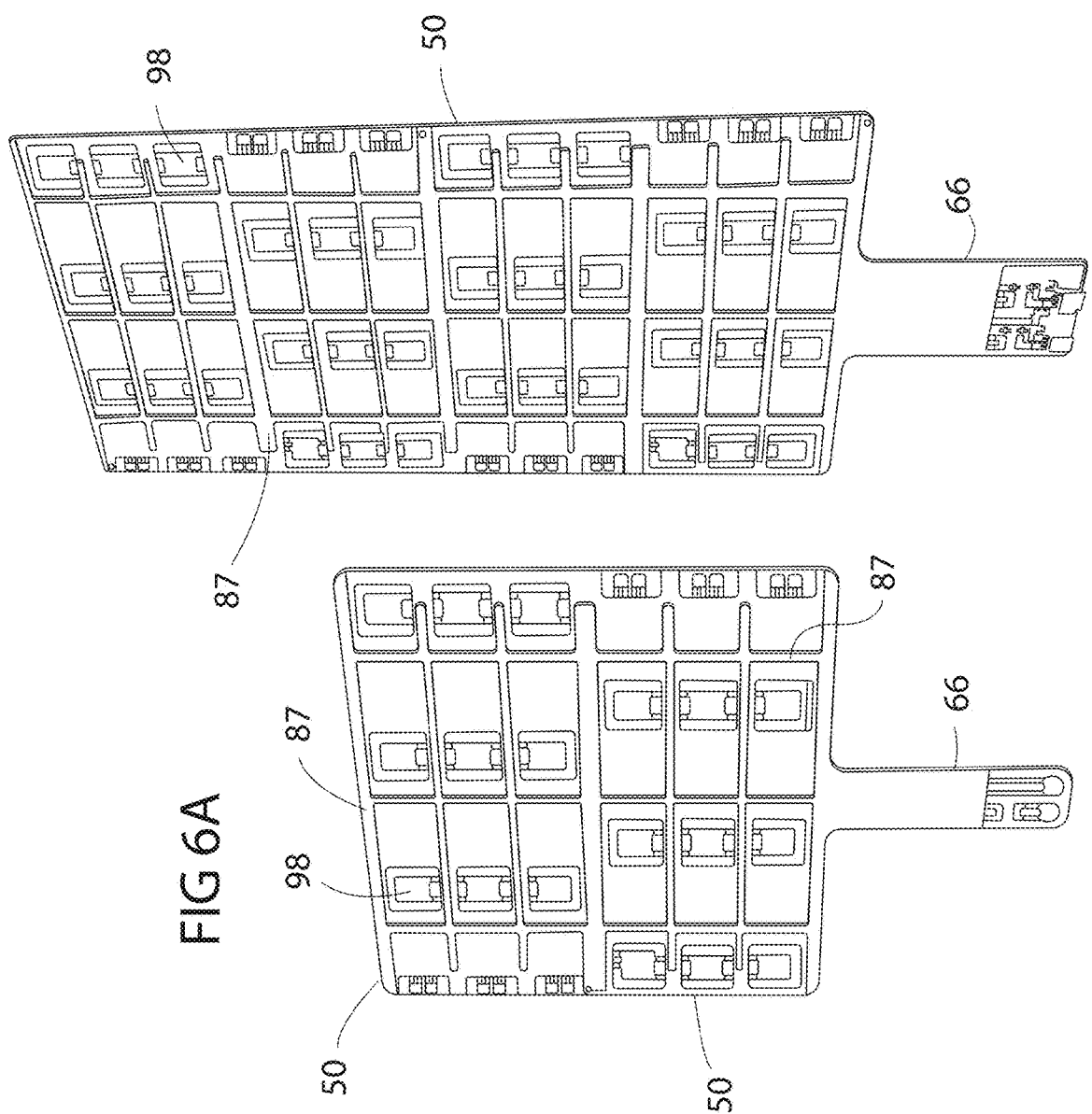

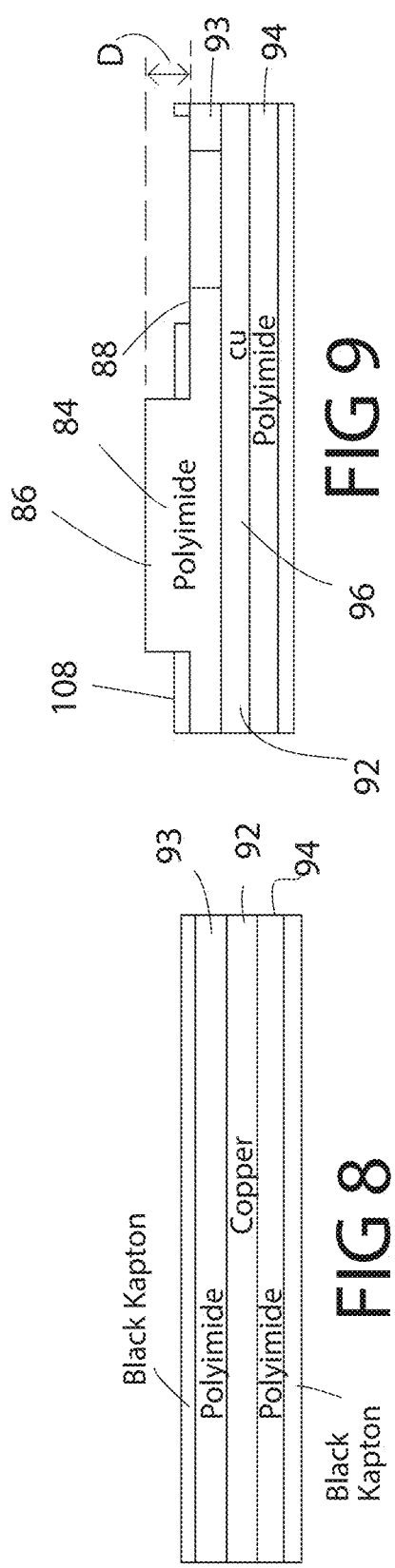
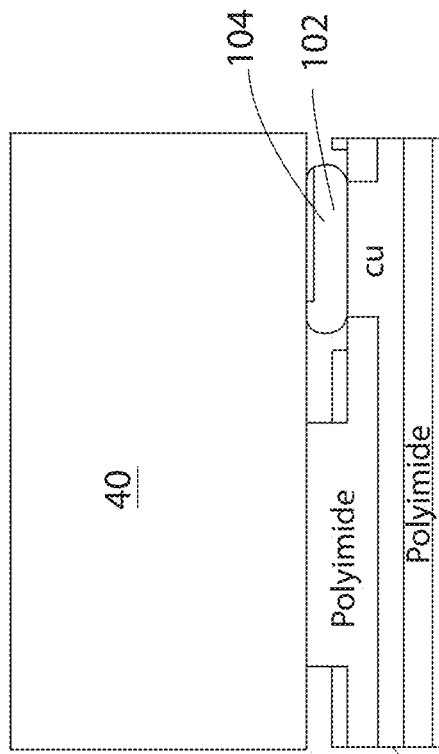
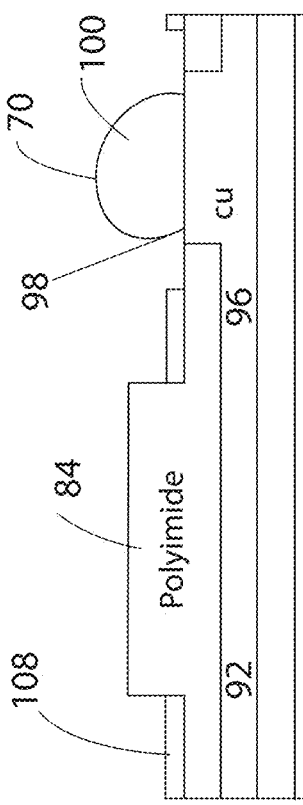
FIG 8
FIG 9
FIG 10
FIG 11

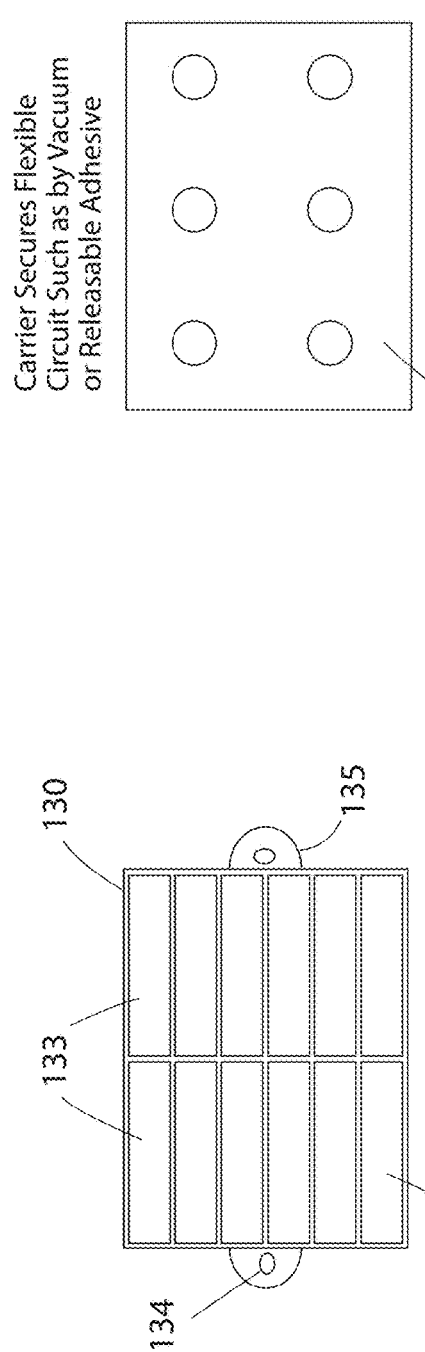
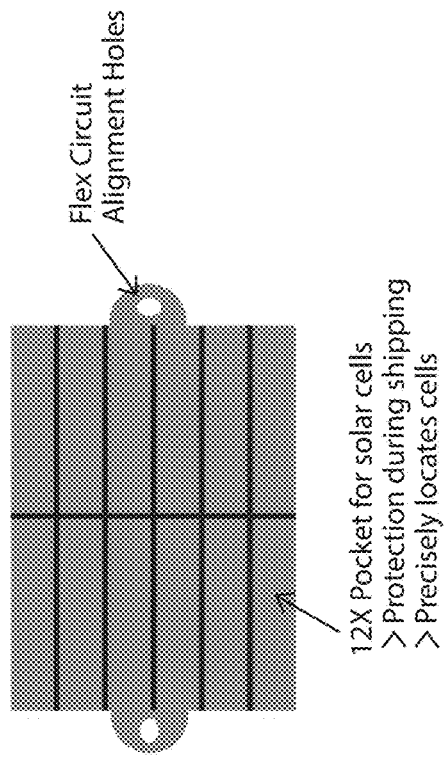

| | |
|---|---|
| Providing a flexible circuit having a conductive layer sandwiched between insulative layers, a first side for mounting a plurality of solar cells, the first side having a base level surface and a raised surface, and having a plurality of conductive pads on the base level surface, the conductive pads extending to the conductive layer | Placing the plurality of solar cells on the first side of the flexible circuit all simultaneously by using a matrix tray holding the plurality of solar cells |
| Providing a flexible circuit having a conductive layer sandwiched between insulative layers, and having a first side for mounting a plurality of solar cells, and having a plurality of conductive pads on the first side, the conductive pads extending to the conductive layer | Heating the flex circuit with solar cells and solder paste on the conductive pads |
| Providing a plurality of solar cells with a front solar energy receiving side and a back side, each of the plurality of solar cells having a surface mount adaptor with a C-shaped portion extending from a P or N pad on the front surface to the back surface, each surface mount adaptor having a back side connection terminal | Installing a plurality of solar cells on a flex circuit without interconnectors extend between adjacent solar cells |
| Dispensing conductive adhesive on the first side of the flexible circuit at each of the conductive pads | Adhering the backside of the flexible circuit to a substrate by adhesive |
| Dispensing robotically a pattern of adhesive on the first side of the flexible circuit | Adhering a coverglass over the plurality of solar cells mounted on the flex circuit by adhesive |
| Applying solder paste on the first side of the flexible circuit at each of the conductive pads | Wrapping an elongate connector strip portion from the front side of the substrate to a back side of the substrate and securing the connector strip portion thereto |
| Placing the plurality of solar cells on the first side of the flexible circuit so that the back side connection terminals align with the conductive adhesive | Surface mount a plurality of bypass diodes on the first side of the flexible circuit before placing the plurality of solar cells thereon |
| Controlling the spacing between the back side of the solar cells and the base level surface of the first side of the flexible circuit by seating the solar cells on the raised portions | Mounting the substrate with the flexible circuit having the solar cells thereon to a spacecraft |

FIG 19

SOLAR PANEL MODULE

CROSS REFERENCE TO RELATED APPLICATIONS

This application claims the benefit of U.S. Provisional Application No. 62/919,692, filed Mar. 22, 2019, the entire contents of which are incorporated by reference herein.

BACKGROUND OF THE INVENTION

Solar array manufacturers strive for maximum power output per unit surface area as well as manufacturing cost efficiencies. Aeronautical and space applications have demanding size and weight restrictions as well as very demanding operating conditions including extreme temperature swings. Solar array designs for aeronautical and space applications with improvements in manufacturing, cost efficiencies and performance would be well received by the industry.

SUMMARY OF THE INVENTION

A solar panel module has a flexible circuit board, a matrix of solar cells surface mounted thereto, a coverglass extending over the matrix of solar cells and the flexible circuit board bonded to a support panel. The flexible circuit board comprising a plurality of polymeric layers and at least one metallic circuitry layer, the flexible circuit board having a first side with a first side surface with the matrix of solar cells mounted thereto, a second side with a second side surface that is secured to the support panel, the flex circuit having circuitry comprising the at least one conductive layer, for example a metallic circuitry layer, for example copper, interconnecting the matrix of solar cells, the circuitry including electrical connection pads in a matrixical arrangement on the first side surface for electrical connection of the circuitry to each of the matrix of solar cells. The matrix of solar cells are surface mounted on the first side of the flexible circuit. The flexible circuit board may further comprise a plurality of flat bypass diodes disposed on the first side surface and connecting to the circuitry. In embodiments, conductive adhesive may adhere each of the solar cells to the flex circuit at the electrical connection pads that correlate to electrical connection points on underside of each solar cells. The flex circuit first side surface may have a plurality of raised landing portions with flat landing surfaces for receiving the matrix of solar cells providing a landing level for the solar cells, the landing surfaces projecting outwardly from a base level surface. The raised landing surfaces providing a specific gap between the flex circuit first side surface level and the lower surface of the solar cells such that the conductive adhesive applied thereto has a uniform thickness and spread during assembly. The conductive adhesive material may be the only adhesive material between the solar cells and the flexible circuit or additional non-conductive adhesive may be utilized for securement of the solar cells to the flexible circuit. Similarly, the distance between the base surface level and the raised landing surface provides a uniformity to the thickness of portions of the nonconductive adhesive. In embodiments, a coverglass extends over the matrix of solar cells. The coverglass may be bonded to the solar cells with a suitable adhesive. In embodiments, each solar cell having a bypass diode, the respective bypass diodes positioned at least partially below the solar cell to which said diode is attached.

In embodiments, the flexible circuit board having a rectangular solar cell receiving region and a connecting strip extending therefrom with a connector end. Bypass diodes may be placed on the first side of the flexible circuit board and blocking diodes placed on the connector strip.

In embodiments, a method of constructing a solar panel module comprises utilizing a flexible circuit with a matrixical arrangement of exposed conductive pads on a top surface of the flexible circuit, dispensing thereon a pattern of conductive adhesive thereon which may be, for example, a plurality of conductive adhesive blobs, placing each of a plurality of solar cells on the blobs of the top surface in a matrixical arrangement. In embodiments, the conductive adhesive is robotically dispensed on each conductive pad, and the solar cells are robotically picked from trays and robotically placed on the flexible circuit. In embodiments, bypass diodes are robotically placed on the flexible circuit. In embodiments the bypass diodes are one of soldered or adhered with conductive adhesive to the flexible circuit. In embodiments the method includes disposing a plurality of blobs of nonconductive adhesive on the top surface of the flexible circuit and utilizing the plurality of nonconductive blobs and the plurality of conductive blobs to secure each of the plurality of solar cells on the flexible circuit. In embodiments the method includes disposing a plurality of blobs of conductive adhesive and exclusively using the blobs of conductive adhesive blobs to secure each of the plurality of solar cells onto the flexible circuit. In embodiments, the conductive adhesive is applied to the top surface of the flexible circuit by way of screen printing; in embodiments, the conductive adhesive is robotically screen printed thereon. In embodiments, the conductive adhesive is applied sites on the solar cells that correspond to the pads on the flexible circuit.

In embodiments, a method of constructing a solar panel comprises attaching a bypass diode for each solar cell to be attached to a top side of a flexible circuit, the diode attached at a position on the flex circuit such that each said diode will be under the respective solar panel. In embodiments, the diode is soldered to a conductive copper pad on the flex circuit. In embodiments, the bypass diode is connected by way of conductive adhesive.

In embodiments, the flexible circuit board having a rectangular solar cell receiving portion and an elongate connector strip portion extending therefrom with a connector end. In embodiments, the solar cell receiving portion is bonded to a first side of a support panel and elongate connector strip portion extends to an opposite side of the support panel. In embodiments, a plurality of flexible circuit boards are bonded to the support panel and each of flexible circuits have an elongate connector strip portion; and in embodiments, each of the elongate connector strip portions are operably connected to a space vehicle.

In embodiments, each rectangular solar cell has an operative solar energy receiving side, also termed a front side, with a solar energy receiving surface, a back side with a back side surface, and an edge wall extending around a periphery of the cell. The operative solar energy receiving side having a plurality of connection pads at the periphery of the cell for connecting said solar cells to other solar cells or to a power supply circuitry. In embodiments, each cell has 3 N-pads on one elongate edge and three P-pads on an opposite elongate edge. In embodiments, the solar cell has a conductive surface mount adaptor at each of the front side connection pads that extends to the back side of the solar cell. Each adaptor having a flattened front side terminal flush with and secured at one of the operative solar energy receiving side connector pads, further having a crossing portion that extends along the edge wall to the back side of the surface, and further having a back side connection terminal for connecting to a flex circuit or a printed circuit board (pcb). In embodiments each adaptor is C shaped or has a C-shaped portion. Each adaptor electrically connected to the respective connector pad. In embodiments, the back side connection terminal is offset from the front side, that is offset from a line extending perpendicularly through the cell from the front side at the front side connector pad to the back side of the solar cell. In embodiments the back side connection terminal is spaced from the back side surface of the solar cell and having an extension portion extending from the crossing portion to the back side connection terminal. The back side connection terminal electrically attached to the flex circuit or printed circuit board. The adaptors providing stress relief between the connection of the adaptor at the front side connection pad and the flex circuit connection.

A feature and advantage of embodiments is that manufacturing efficiencies are provided that lower the cost of solar modules. Embodiments are highly suitable for automated robotic assembly. In embodiments, carriers for the flexible circuit cooperate with carriers for the solar cells. In embodiments, the flexible circuit has alignment portions that positively align the flexible circuit with the carrier, for example parallel pins on the carrier that are received into corresponding holes on the flexible carrier. In embodiments, the holes are on tabs extending from the flexible circuit. A matrix tray for holding a plurality of solar cells may also have alignment portions, holes to align with pins on a matrix tray, or pins to align with holes on a flexible circuit.

In embodiments, a method of constructing a solar panel module comprises utilizing a flexible circuit with an arrangement of exposed conductive pads on a top surface of the flexible circuit, dispensing thereon a plurality of solder paste blobs placed on the pad, placing each of a plurality of solar cells on the blobs of the top surface in an aligned arrangement. In embodiments, the solder paste is robotically dispensed on each conductive pad, and the solar cells are robotically picked from trays and robotically placed on the solder paste. The flexible circuit with solar cells is heated to melt and bond the solder paste blobs to the solar cells and conductive pads. In embodiments, bypass diodes are robotically placed on the flexible circuit. In embodiments the bypass diodes are one of soldered or adhered with conductive adhesive to the flexible circuit.

In embodiments, the method comprises utilizing a flexible circuit with a top side having a base level with a base level surface and a raised level with a raised level surface with the conductive pads exposed on the base level surface. The raised surface may be provided by one or more layers or an increased thickness of polyimide in localized areas. In embodiments, the raised level may be configured as a grid work. In embodiments, the raised level may be configured as a plurality of standoffs shaped as pillars or elongate ribs. The solar cells each engaging the raised surfaces and being adhered to the top surface of the flexible circuit by way of adhesive at the base level surface and/or the raised surfaces. In embodiments, each of the solar cells being adhered to the top surface of the flexible circuit exclusively by way of conductive adhesive that is on the base level surface. In embodiments, nonconductive adhesive is applied to the raised surfaces. A feature and advantage of placing the solar cells on the standoffs on the flexible circuit is that a uniform distance between the base level and the back side of the solar cells is provided allowing uniformity in the thickness and size of the conductive adhesive blobs that extend between the conductive pads and the solar cells. Where there is separate nonconductive adhesives, the constant gap is also advantageous for the same reasons, uniformity of thickness and size of the non conductive adhesive blogs are facilitated. Moreover, placement of all of the solar cells on the standoffs provide uniformity in the height of the solar cells facilitating a placement of a coverglass over more than the usual number of solar cells; for example twelve or more solar cells under a single coverglass. Placing solar cells or blobs of adhesive without the standoff subjects the height of the top surface of the solar cell above the top surface of the flexible circuit to the application pressure of the cell on the flexible circuit, greater pressure and the more the blobs are compressed resulting in a thinner and diametrically larger blob.

DESCRIPTION OF THE FIGURES

FIG. 1 is a perspective view of a space vehicle configured as a Satellite having solar panel modules.

FIG. 2 is a perspective view of a pair of solar panel modules.

FIG. 4A is a perspective view of a solar cell with surface mount adapters thereon.

FIG. 4B is a perspective view of a surface mount adapter for a solar cell.

FIG. 6A is a perspective view of a flexible circuit with raised standoff portions.

FIG. 6B is a perspective view of a flexible circuit with raised standoff portions.

FIG. 8 is a cross-sectional view of a flexible circuit with a single conductive metallic layer.

FIG. 9 is a cross-sectional view of an embodiment with standoffs in the flexible circuit.

FIG. 10 is the flexible circuit of FIG. 9 with a blob of conductive adhesive placed on a pad.

FIG. 11 is a cross-sectional view of the flexible circuit of FIG. 10 with the solar cell seated there on.

FIG. 13 is a schematic view of a carrier for a flexible circuit.

FIG. 15 is a plan view of a matrix tray for solar cells.

FIG. 17 is a plan view of a matrix tray for solar cells.

FIG. 19 is a table of steps in accord with embodiments.

Figure 3A:
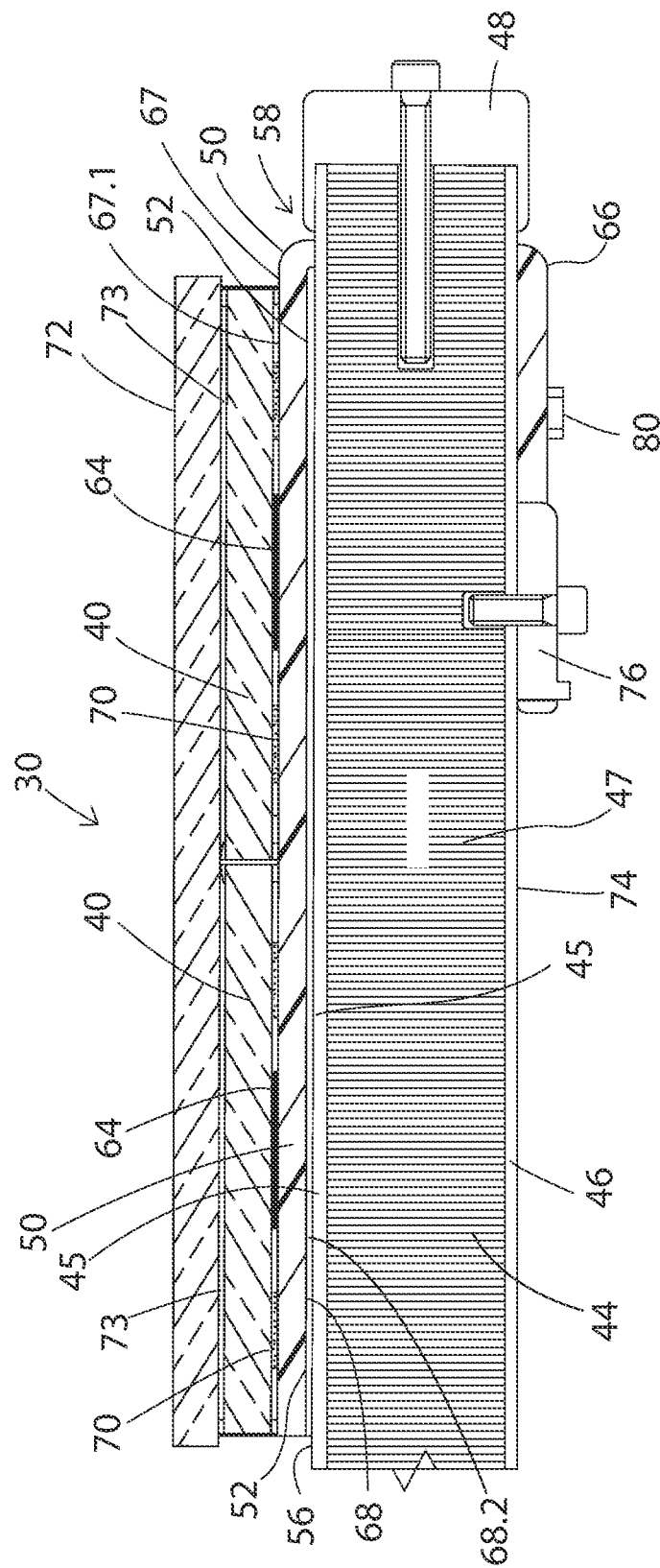
FIG. 3A is a cross-sectional view of a solar panel module.

While embodiments of the disclosure are amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Referring to FIG. 1, a space vehicle 20 is illustrated with a central body portion 22 and a pair of deployed solar arrays 24, 26. Each array comprising a plurality of solar panel modules 30. Additionally, the space vehicle body may also have one or more solar panel modules 32 attached thereto. Referring to FIG. 2, to a portion of a deployed solar array is illustrated showing two solar panel modules 30 connected by a bus assembly 38. Each solar panel module comprising a multiplicity of solar cells 40 closely packed together in a matrixical array 42 and mounted upon respective support panels 44.

Figure 5A:
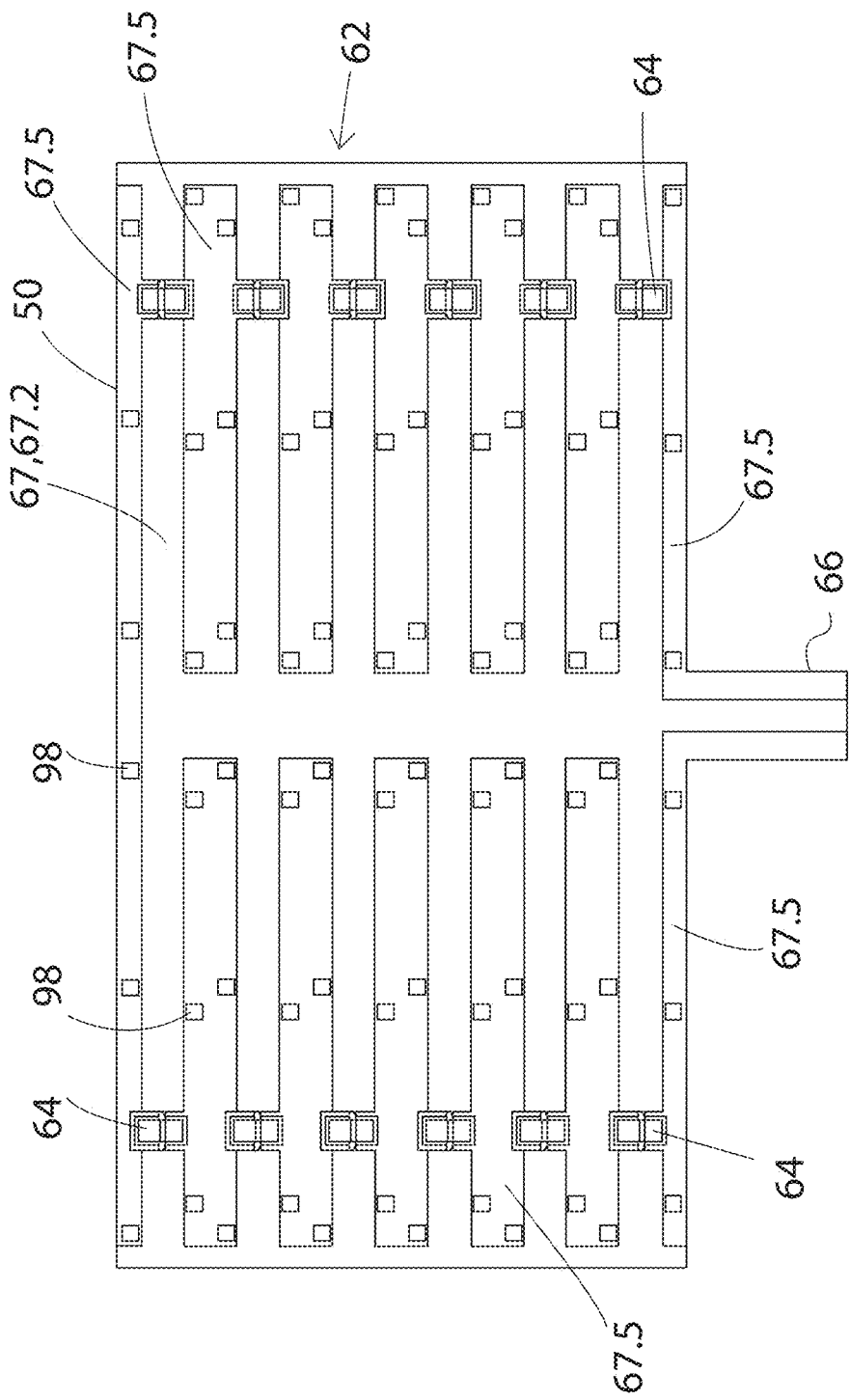
FIG. 5A is a plan view of a flexible circuit.

Referring to FIG. 3A, cross-sections through the solar panel module 30 illustrate the components of embodiments. The support panel may have face sheets 45, 46, a honeycomb core 47 providing rigidity and light weight, and an end cap 48. A flexible circuit 50 (often termed a "flex circuit") is bonded by way of an adhesive layer 52 to a planar front side surface 56 of a front side 58 of the support panel 44. FIG. 5A illustrates a flexible circuit 50 suitable for use in this embodiment. The flexible circuit has a solar cell mounting portion 62 and an elongate connector strip portion 66. The flexible circuit 50 has a front or top side 67 with a front side surface 67.2 and a back side 68 with the backside surface 68.2. Other than the exposed conductive pads 98 and the pads with the bypass diodes 64, the entirety of the front side 67 is an insulative layer such as polyimide. Polyimide has transparency so that copper strips 67.5 that define a conductive layer 67.6 in the flex circuit 50 are visible through the insulative layer. The bypass diodes may be attached by conductive adhesive or solder.

In embodiments, the solar cells are attached to the flexible circuit by way of conductive adhesive portions 70 (identified by the dense dots) configured as blobs that are placed on exposed copper pads 98 and that connect to surface mount adaptors, not shown in this view, that extend to the top surface of the solar cell. The solar cells are covered by a coverglass 72 and are bonded there too by way of an adhesive 73. The connector strip portion 66 of the flexible circuit 50 extends through an opening (not shown) in the support panel to a backside 74 of the support panel 44 and has a connector 76 for connection to, for example, the bus assembly. One or more blocking diodes 80 are attached to the connector strip portion 66 proximate the connector 76.

Figure 3B:
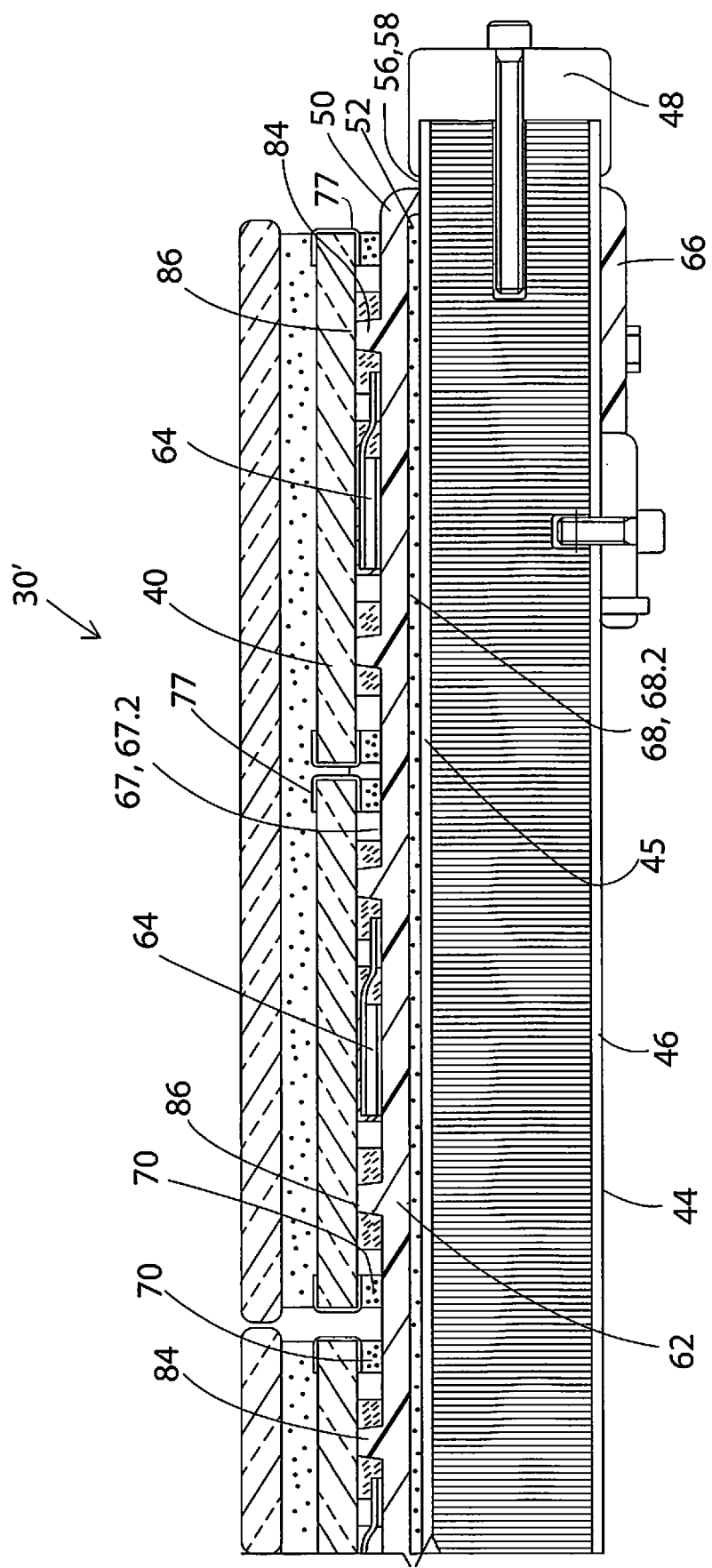
FIG. 3B is a cross-sectional view of an embodiment of a solar panel module.

Referring to FIG. 3B another embodiment of a solar panel module 30' is illustrated in cross section with solar cells 40 having surface mount adapters 77. FIGS. 4A and 4B illustrate the solar cell 40 and the surface mount adapter 77. The solar cell 40 has a front solar energy receiving side 78 with a front side surface 78.1, an opposite back side 78.2 with a back side surface 78.3, an edgewall 78.4 with an edgewall surface 78.5, and a periphery 78.6. On the front side are front side are a plurality of exposed connection pads 79 including P-pads 79.1 and N-pads 79.2, with the surface mount adaptor 77 on each pad. The adapter is generally C-shaped and has flattened front side terminal 79.5 and a flattened back side connection terminal 79.7.

Referring to FIGS. 3B-4B and 5B, the flexible circuit 50 of solar panel module 30' has a plurality of raised seating portions or stand-offs 84. The standoffs each have a raised surface 86 on which the solar cells 40 may seat. The support panel may have face sheets 45, 46, a honeycomb core 47 providing rigidity and light weight, and an end cap 48. The flex circuit 50 is bonded by way of an adhesive layer 52 to a planar front side surface 56 of a front side 58 of the support panel 44. The flexible circuit has a solar cell mounting portion 62 and an elongate connector strip portion 66. The flexible circuit 50 has a front or top side 67 with a front side surface 67.2 and a back side 68 with the backside surface 68.2. Attached to the top side surface are the solar cells 40, and in embodiments, bypass diodes 64. The solar cells are attached to the flexible circuit both by way of conductive adhesive portions 70 and non-conductive adhesive portions 70.2, both which may be configured as blobs, with the conductive adhesive blobs placed on exposed copper pads 98 on the front side of the flex circuit, not shown in this view and that also connect to the surface mount adapters 77. The non conductive adhesive 70.2 connecting the solar cells to the flex circuit is indicated by diagonal short dashes in the figures.

Figure 5B:
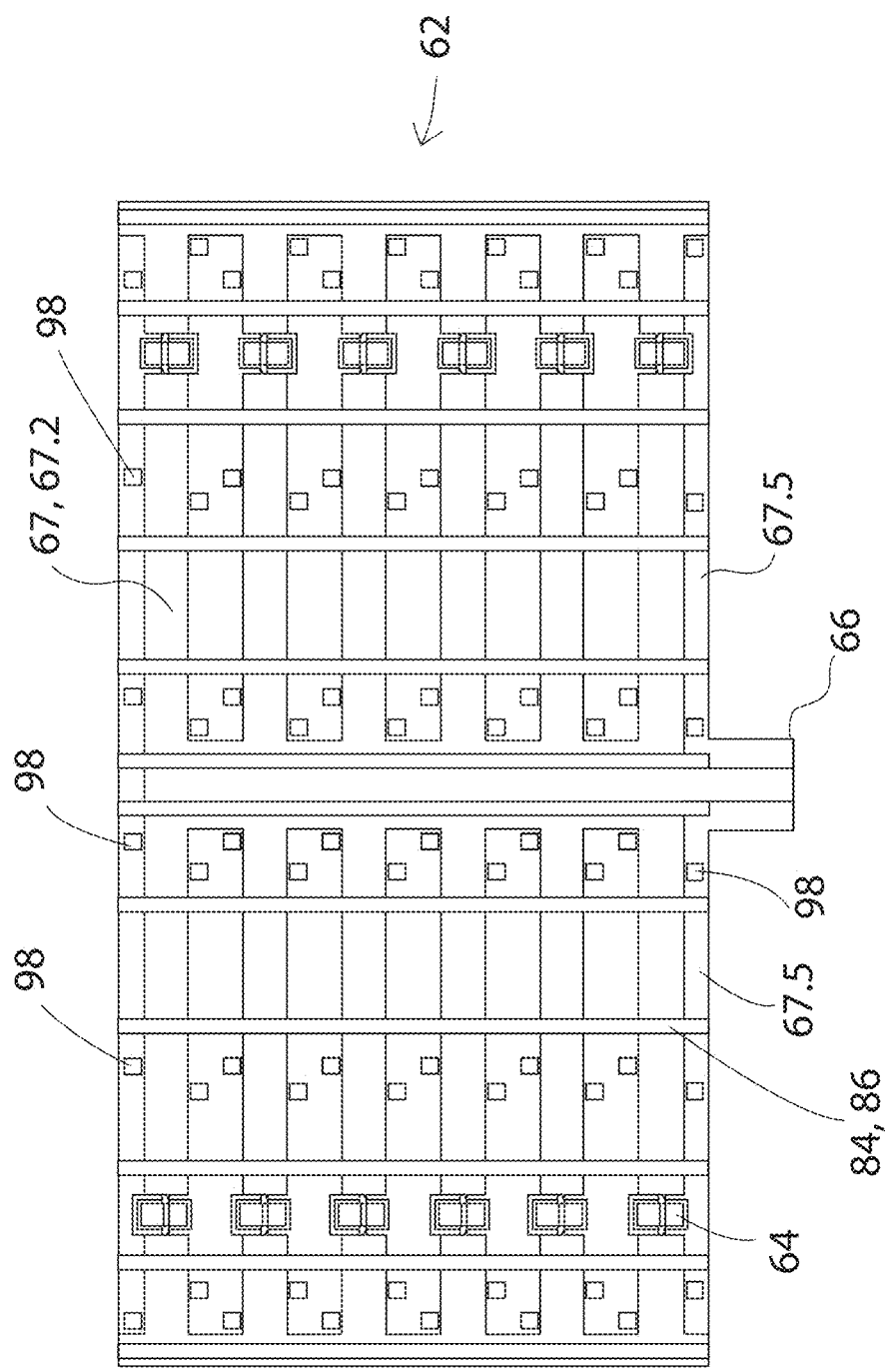
FIG. 5B is a plan view of a flexible circuit with raised standoff portions.

In embodiments, the standoffs 84 may be configured as a grid 87 as illustrated in FIGS. 6A and 6B or as ribs as illustrated in FIG. 5B or pillars or other configurations.

Figure 5C:
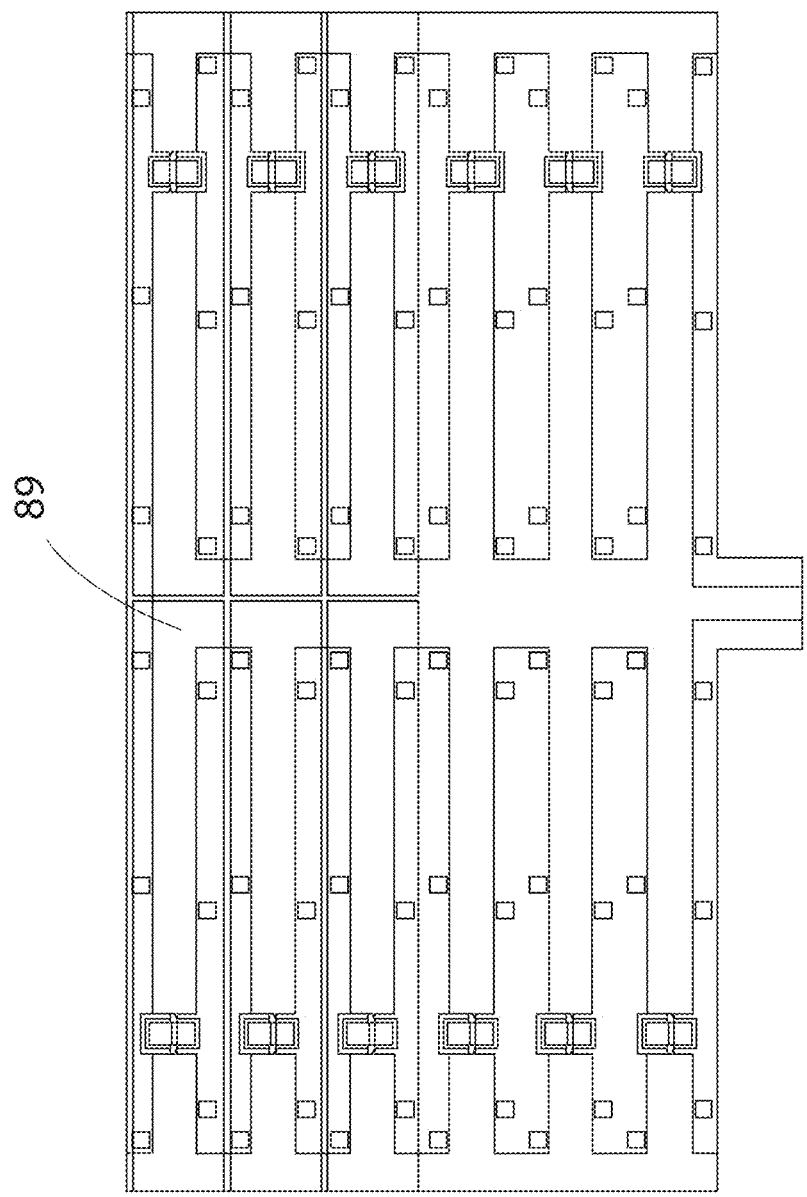
FIG. 5C is a plan view of the flexible circuit of FIG. 5A illustrating solar panel receiving positions.
Figure 5D:
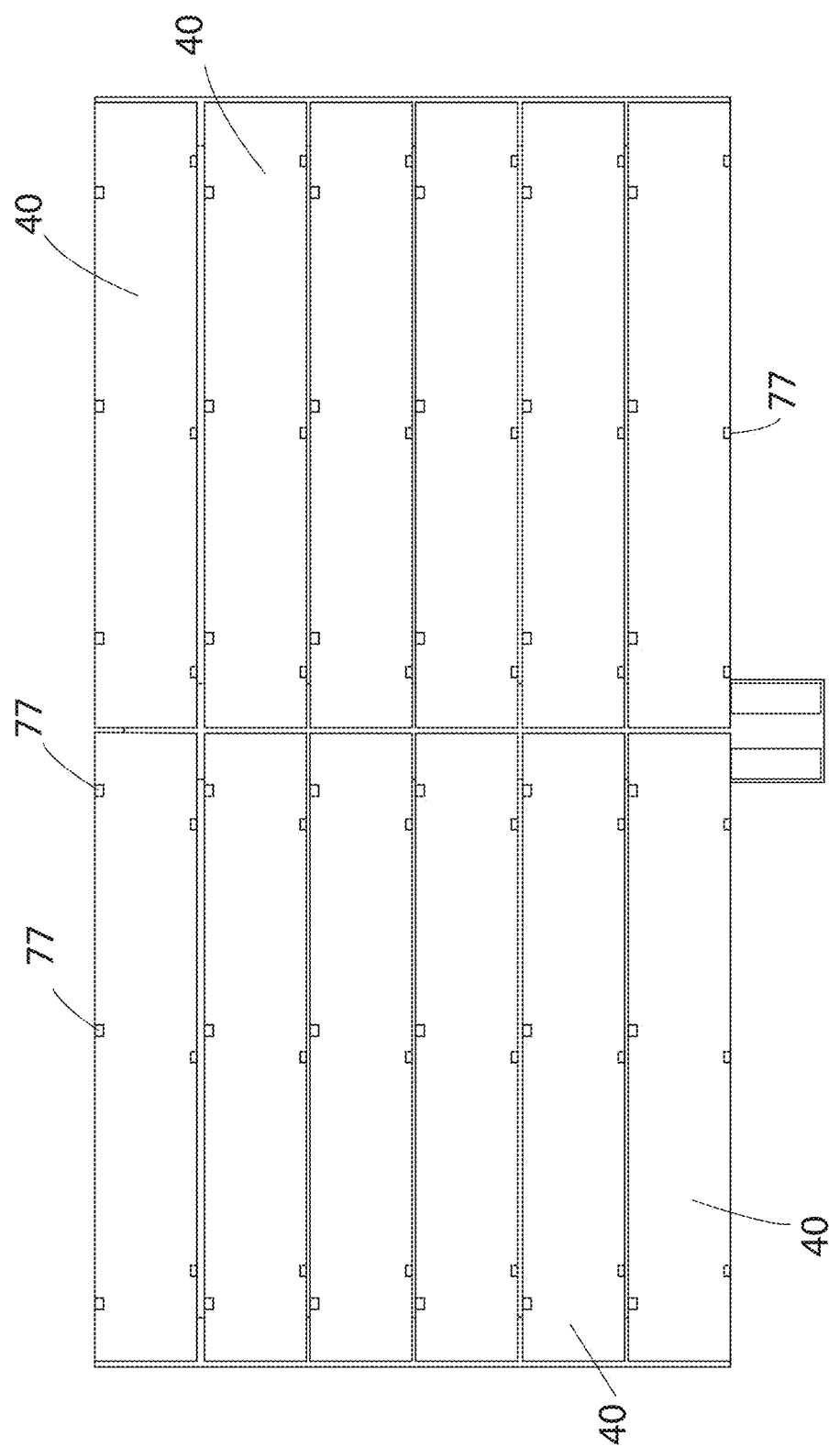
FIG. 5D is a plan view of the flexible panel of FIG. 5A with solar cells attached thereto.

FIG. 5C illustrates six solar cell receiving regions 89 on the flex circuits of FIGS. 5A and 5B. FIG. 5D illustrates twelve solar cells 40 placed in all regions providing the closely packed matrixical array 42, the solar cells having surface mount adapters 77 exposed on the solar energy receiving side of the solar cells, the adapters extend around the edges of the respective solar cells to be conductively connected to the copper pads 98 on the flex circuit.

Figure 7:
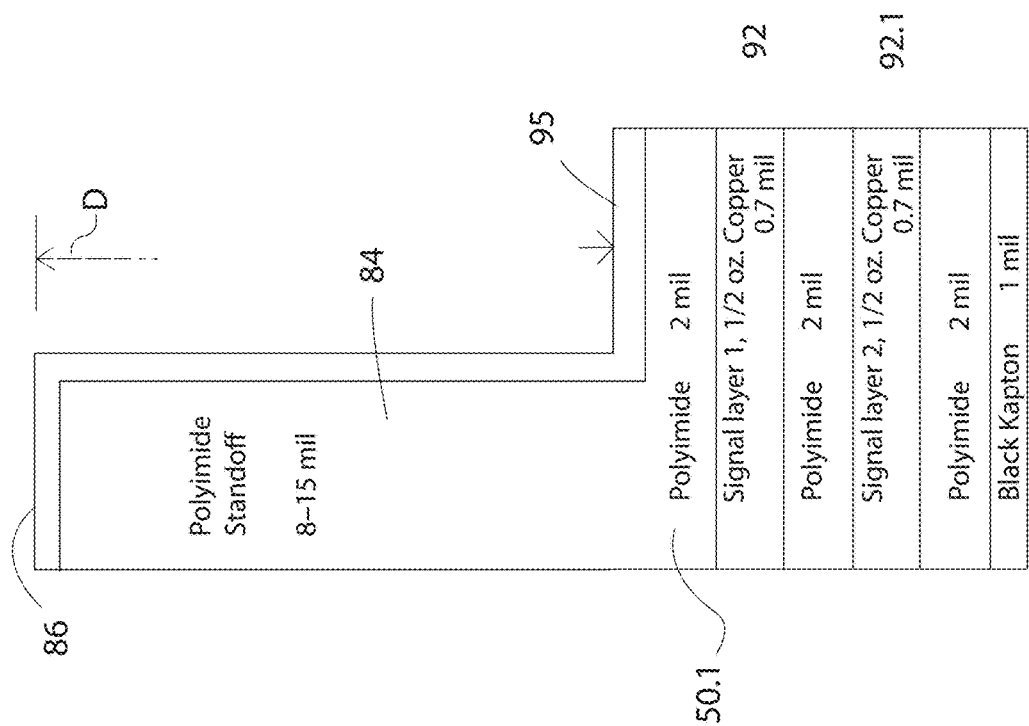
FIG. 7 is a cross-sectional view of a flexible circuit with two conductive metallic layers and depicting exemplary and relative thicknesses.

Referring to FIGS. 7-11, several embodiments of the layering of flex circuits suitable for embodiments are illustrated. FIG. 7 illustrates a flexible circuit 50.1 layered arrangement with two copper conductor layers 92, 92.1. The polyimide standoff 84 may in embodiments have a Black Kapton static dissipative layer thereon, in embodiments the standoff will not have the layer. FIG. 8 is a flexible circuit arrangement with a single conductor layer. The raised surface extending a distance D above a base level surface 88. The height of the bypass diodes 64 being less than or equal to the distance D. In embodiments, the bypass diodes are 0.005 to 0.007 inches thick and they extend outwardly or upwardly from the base level 95 of the flexible circuit 50 that distance. The conductive layer may comprise copper and defines circuitry 96 with electrical connection pads 98 exposed on the top surface 58 of the flexible circuit. The circuitry comprising a plurality of conductor strips 97 within the solar cell mounting portion and conductors 92 in the connector strip portion 66. The conductor strips arranged to connect the solar cells that attach to the respective flexible circuit in series.

The flexible circuit 50 in cross-section of FIGS. 9-11, have a conductive layer 92 sandwiched between a pair of insulative layers 93, 94, for example polymeric layers, such as polyimide. The copper layer may be 0.0007 to 0.001 inches thick, the polyimide insulative layers may be 0.002 to 0.004 inches thick. The standoffs may be created by additional polyimide material on the upper insulative layer 93 and may be, for example, 0.008 to 0.015 inches high, projecting outwardly from a flex circuit base level 95, see FIG. 7. Techniques for manufacturing flexible circuits are known in the art.

FIG. 10 illustrates a blob 70 of conductive adhesive material 100 that has been dispensed on the pad. As a solar cell is seated on the raised seating portions or stand-offs the blob is compressed and forms a connection 102 between the back side connections 104 of the solar cell and the circuitry 96, see FIG. 11. The back side connection can be the surface mount adapter 77 as best shown in FIGS. 4A and 4B. The flexible circuit may have a polymeric, such as polyimide, static dissipative exterior layers 106, 108 for prevention of buildup of static charges. Such layers may be 0.001 inches thick. The dimensions disclosed in the Figures are exemplary, suitable ranges for such dimensions are plus or minus 25% of any of the given parameters.

The flexible circuits having circuitry 96 connecting the solar cells in series with a bypass diode positioned on the front or top side of the flexible circuit, each bypass diode being thin and flat and positioned below or at the same elevation as standoffs that are unitary with an insulative layer of the flexible circuit. Such thin bypass diodes are known. The insulative layer may comprise polyimide.

Figure 12:
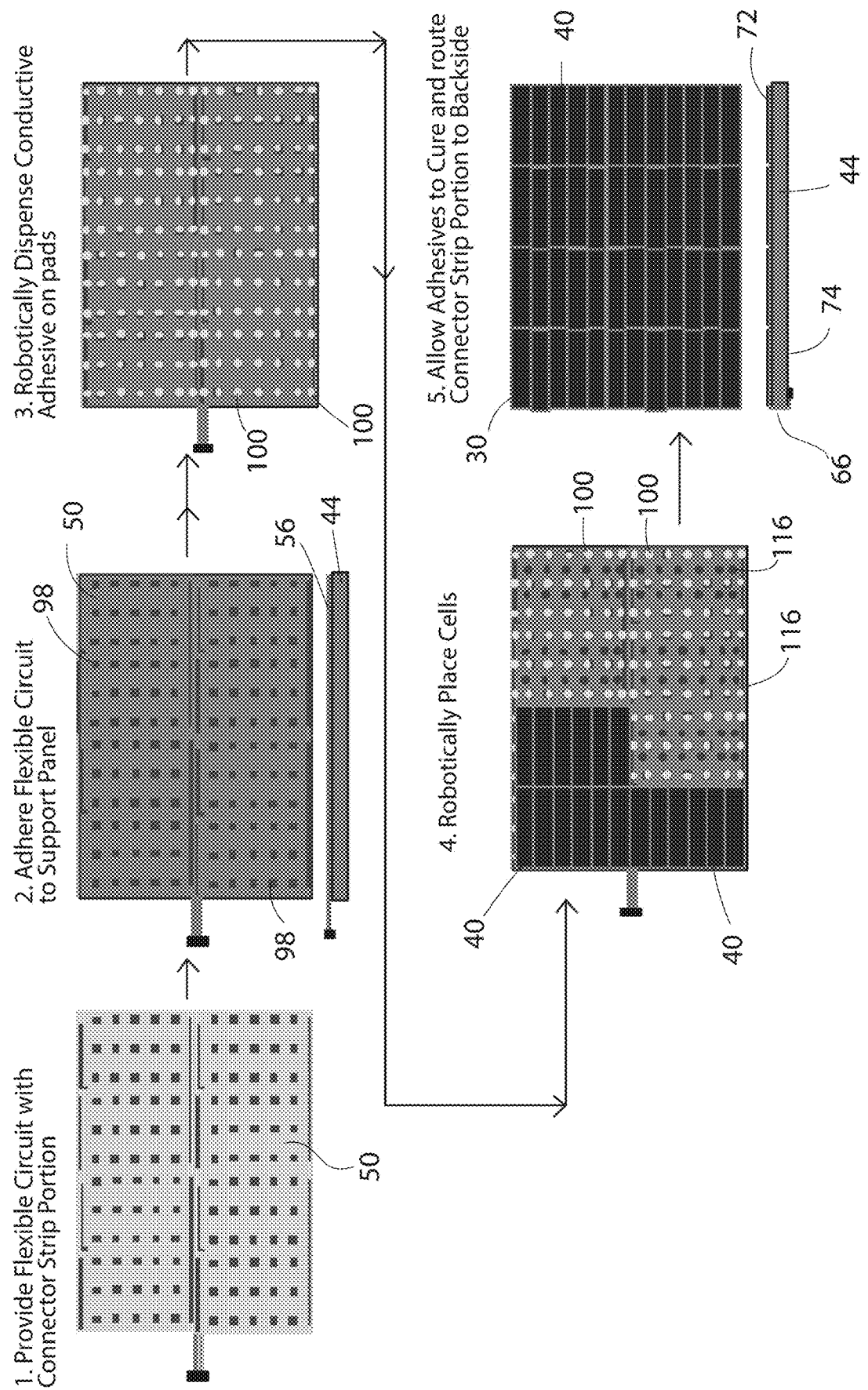
FIG. 12 is a diagrammatic view of a manufacturing process for solar panel modules.

In embodiments, the solar panel modules described herein are amenable to automated robotic manufacturing, particularly pick and place of components and spot dispensing of adhesives, conductive and nonconductive, and alignment of respective components and fixtures. Referring to FIG. 12 suitable steps in manufacturing a solar panel module include providing a flexible circuit board 50 with circuitry 96 and exposed electrical connection pads 98, adhering the flexible circuit board to a planar surface of a support panel 44, robotically dispensing conductive adhesive onto the connection pads, robotically placing the solar cells onto the flexible panel. Nonconductive adhesive 116 blobs may also supplement the adhesion provided by the conductive adhesive 100. The connector strip portion 66 is wrapped around the side 119 of the support panel to be secured to the back side 74 of the panel. A coverglass 72 is secured over the solar cells such as by a layer of adhesive.

Figure 14:
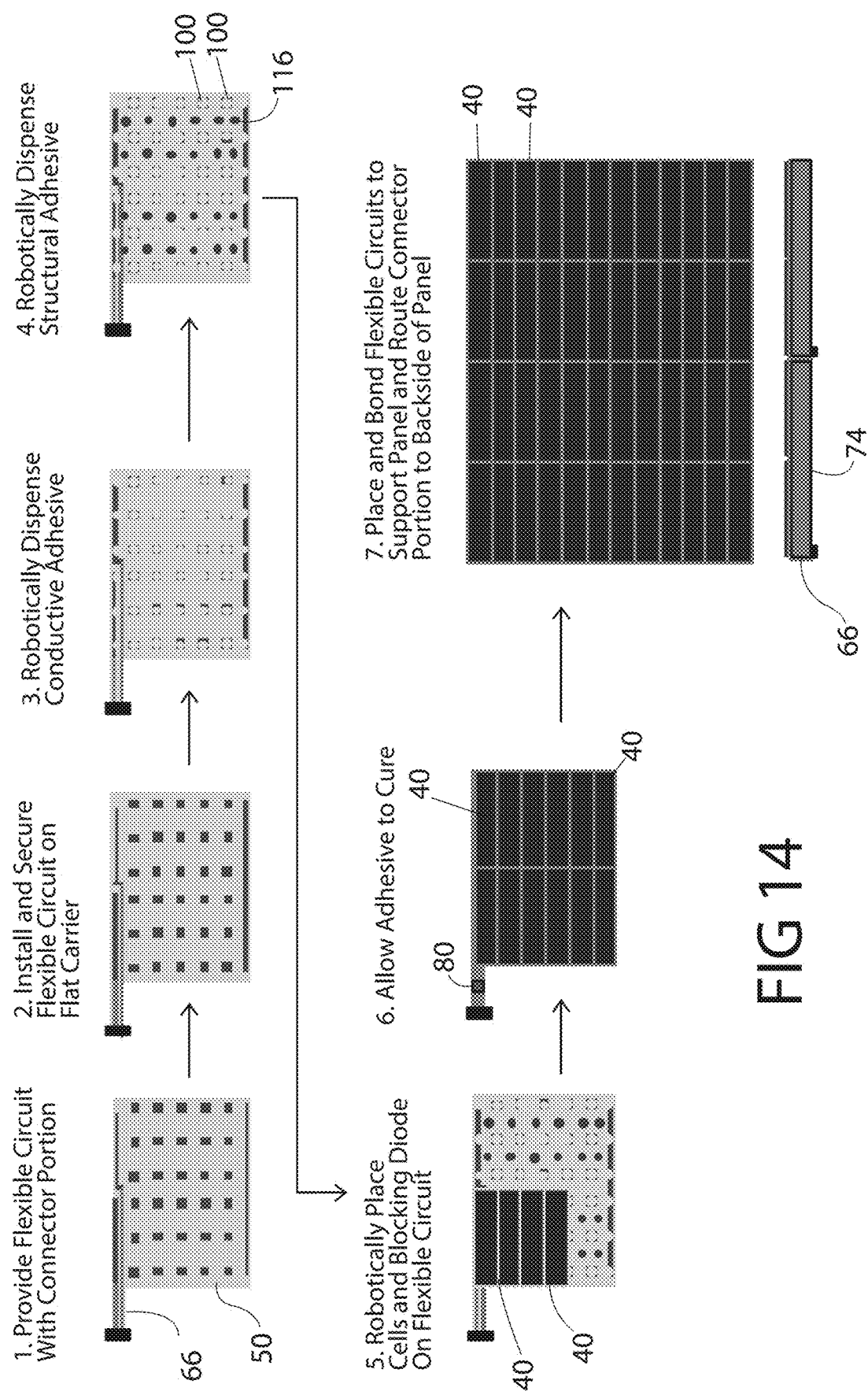
FIG. 14 is a diagrammatic view of a manufacturing process of solar panel modules.

Referring to FIGS. 13 and 14, in and embodiment a rigid carrier 124 is utilized to hold the flexible circuit while adhesive is dispensed and as solar cells are picked up and placed there on. Conductive adhesive 100 may be placed on the electrical connection pads 98, instead of solder, and may be supplemented by structural non-conductive adhesive 116. The solar cells 40 are picked up and placed upon the flexible circuit secured by the carrier 124. The adhesive is allowed to cure and then a plurality of the flexible circuits with solar cells thereon our mounted onto a support panel 44 with the elongate connector strip portions 66 are routed to the backside 74 of the panel for a connection to, for example, a bus assembly.

Figure 16:
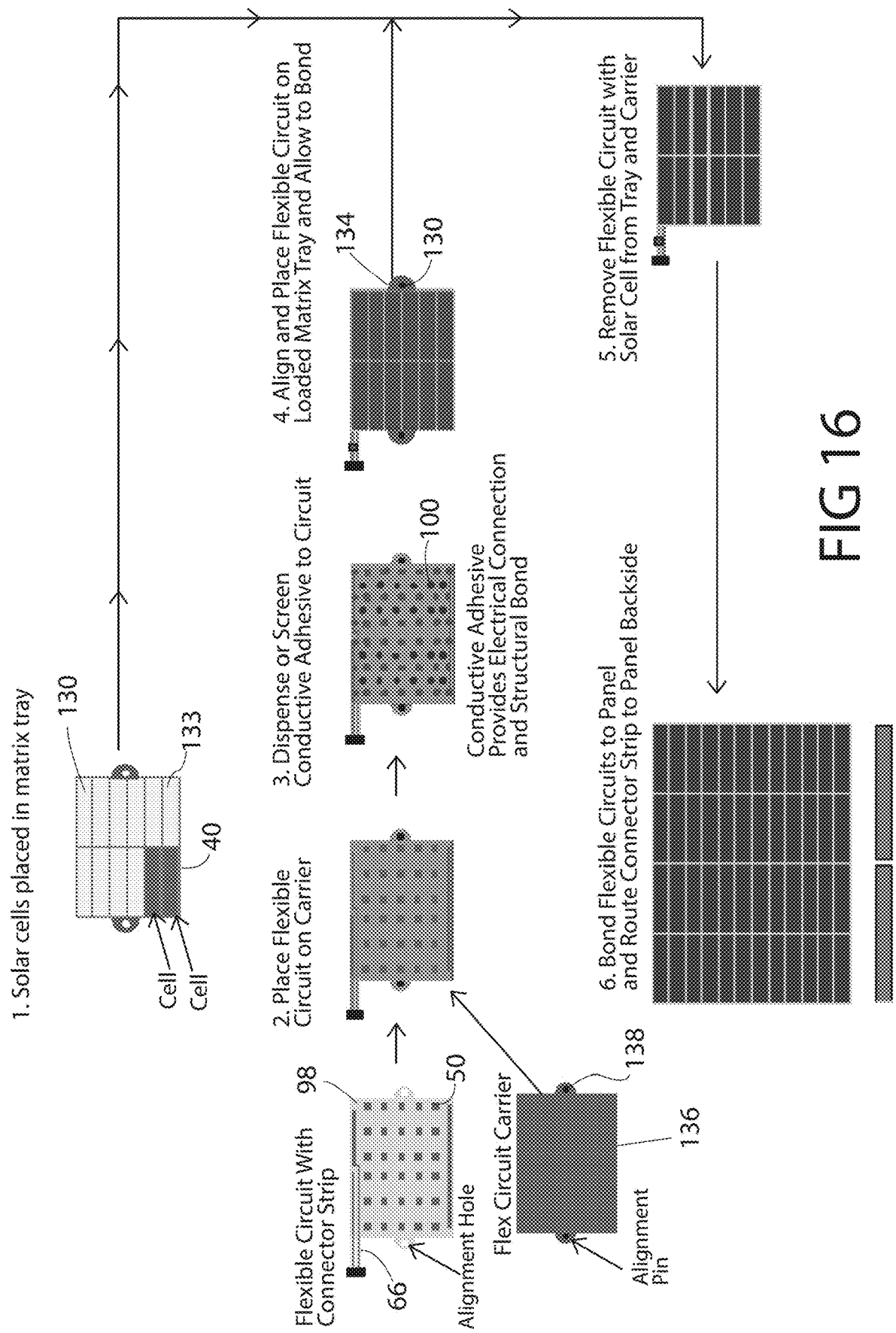
FIG. 16 is a diagrammatic view of manufacturing steps for the manufacture of solar panel modules.
Figure 18:
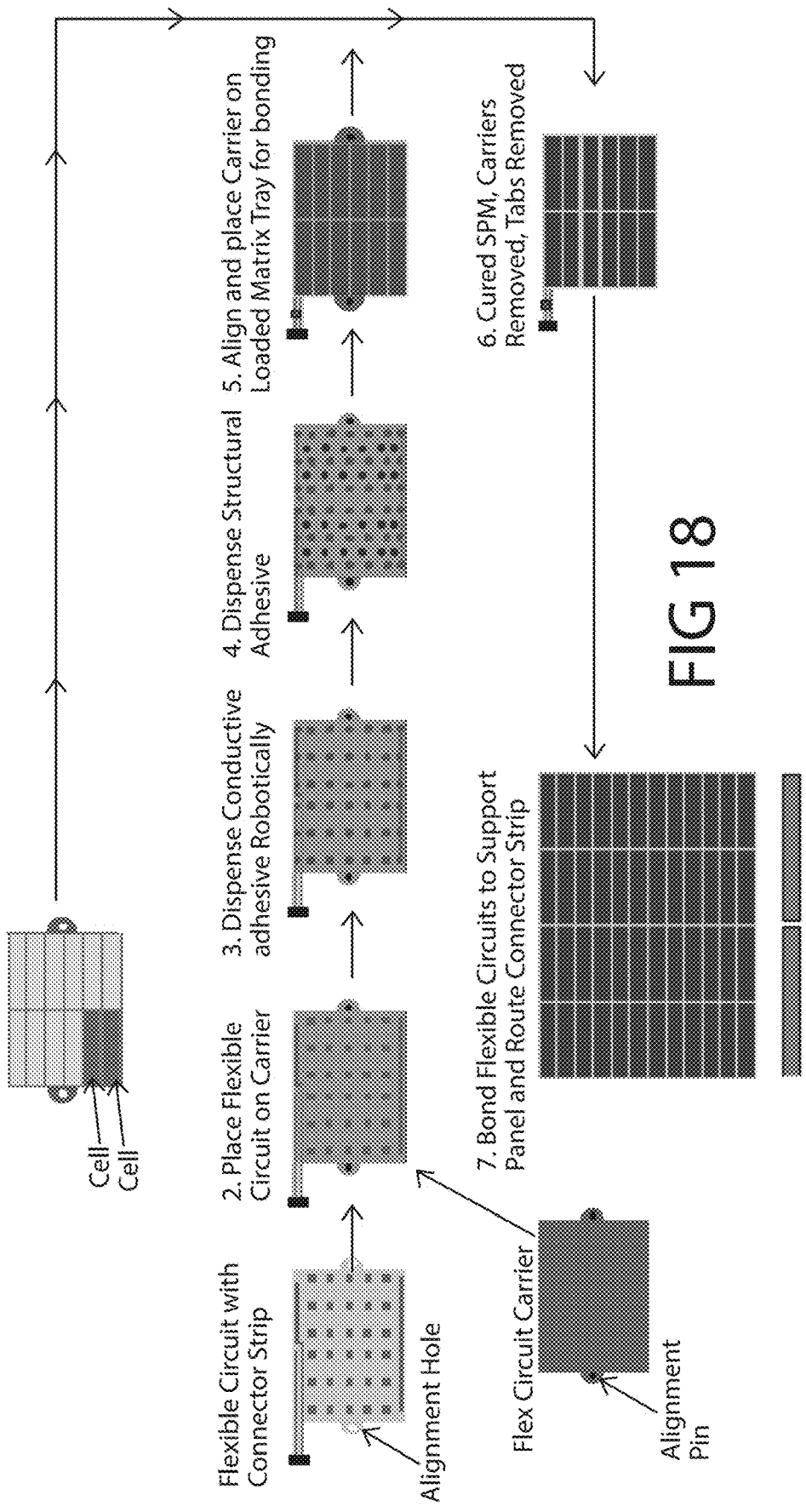
FIG. 18 is a diagrammatic view of manufacturing steps for the manufacture of solar panel modules.

Referring to FIGS. 15 and 16, in embodiments, a solar cell matrix tray 130 with solar cell pockets 133 and alignment portions 134, such as a pair of tabs 135 with alignment holes, cooperates with a flexible circuit carrier 136 with cooperating alignment portions 138, such as tabs with pins. The solar cell matrix tray 130 can arrive at the manufacturing facility pre-loaded with solar cells or may be loaded at the manufacturing facility. The matrix tray has a capacity of, for example, 12 cells. The flexible circuit 50 with connector strip portion 66 has a cooperating alignment portion 142, for example pin holes thereon, to key with the alignment portions of the flexible circuit carrier and alignment portions of the matrix tray. The flexible circuit 50 is installed on the carrier 136 and positioned for application of the conductive adhesive such as by robotic spot dispensing or by screening. The carrier with the flexible circuit installed thereon, the flexible circuit having uncured conductive adhesive, is aligned with and joined to the matrix tray with the solar cells seated therein thereby adhering the solar cells to the flexible circuit by way of the conductive adhesive. Such may be performed robotically. Referring to FIGS. 17 and 18, a similar process is illustrated including robotically dispensing conductive adhesive and nonconductive structural adhesive.

Referring to FIG. 19, discrete steps associated with embodiments herein are illustrated. These steps can be selected and combined in any order and with any of the steps identified in FIGS. 12-18.

The solar cell mounting portion of the flexible circuit is bonded to the planar surface of the support panel. In embodiments, a bonding layer coats the entirety of the lower surface of the solar cell mounting portion. In embodiments, the bonding layer coats most of the lower surface of the solar cell mounting portion.

In embodiments, the surface area of the solar cell attachment portion is several times as great as the area of the connector strip portion. In embodiments the solar cell attachment portion is substantially rectangular with a width and a length and the connector strip portion has a length and a maximum width, the maximum width being 0.30 or less the width of the solar cell attachment portion. In embodiments, the width being 0.20 or less the width of the solar cell attachment portion. In embodiments, the length of the strip portion is at least 5 times the maximum width of the strip portion.

When used herein "connected" and "attached" do no required direct physical contact between the components at issue, there may be intermediate components or material, for example adhesive material.

The following U.S. patents and patent publications are incorporated by reference herein for all purposes: U.S. Pat. Nos. 5,723,205; 7,709,729; 8,356,770; 2010/0114679; 2011/0126878; 9,214,573; 9,214,892; 9,748,432; 9,960,301; 9,728,663; 9,882,330; and 10,475,944. All of the features disclosed in this specification (including the references incorporated by reference, including any accompanying claims, abstract and drawings), and/or all of the steps of any method or process so disclosed, may be combined in any combination, except combinations where at least some of such features and/or steps are mutually exclusive.

Each feature disclosed in this specification (including references incorporated by reference, any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing and claimed embodiments. The invention extends to any novel one, or any novel combination, of the features disclosed in this specification (including any incorporated by reference references, any accompanying claims, abstract and drawings), or to any novel one, or any novel combination, of the steps of any method or process so disclosed. The above references in all sections of this application are herein incorporated by references in their entirety for all purposes. The inventive processes may interchange steps and delete steps. That is, it is not contemplated that the inventions herein require all of the steps as described or claimed. Individual steps or combinations of a few steps are contemplated to be inventive.

Although specific examples have been illustrated and described herein, it will be appreciated by those of ordinary skill in the art that any arrangement calculated to achieve the same purpose could be substituted for the specific examples shown. This application is intended to cover adaptations or variations of the present subject matter. Therefore, it is intended that the invention be defined by the attached claims and their legal equivalents, as well as the following illustrative aspects. The above described aspects embodiments of the invention are merely descriptive of its principles and are not to be considered limiting. Further modifications of the invention herein disclosed will occur to those skilled in the respective arts and all such modifications are deemed to be within the scope of the invention.

What is claimed:

1. A solar panel module comprising a flexible circuit, a matrixical arrangement of at least twelve solar cells disposed on the flexible circuit, a coverglass extending over the entire matrixical arrangement, and a support panel with a planar surface to which the flexible circuit is attached:

the flexible circuit comprising a copper circuitry layer sandwiched between at least two layers of polyimide, one of the at least two layers defining an uppermost layer of polyimide, the flexible circuit having a top side with a top surface and a bottom side with a bottom surface, the flexible circuit having a solar cell mounting portion and an elongate connector strip portion extending from the solar cell mounting portion, the top side of the solar cell mounting portion at least partially defined by the uppermost layer of polyimide, the uppermost layer of polyimide providing a base level with base level surface and one or more raised polyimide stand-offs extending from and unitary with the uppermost polyimide layer, the one or more raised stand-offs each with a raised solar cell seating surface, the copper circuitry layer defining circuitry and positioned below the uppermost polyimide layer, the circuitry having copper extending through the uppermost polyimide layer defining electrical connection pads at the base level surface, the electrical connection pads separated and spaced from the raised stand-offs at the base level surface, wherein the base level surface extends between the raised stand-offs and the electrical connection pads for connection to the solar cells and conductors extending along the elongate connector strip portion;

the matrixical arrangement of solar cells adhered to the top surface of the flexible circuit; each solar cell having a top side for receiving solar energy and a back side and back side connector that is operably connected to the circuitry by way of conductive adhesive extending between the electrical connection pads of the solar cell mounting portion of the flexible circuit and the back side of each respective solar cell, each solar cell having a respective bypass diode positioned on the flexible circuitry and operably connected to the respective solar cell through the circuitry of the flexible circuit;

one or more blocking diodes operably connected to the circuitry on the elongate connector strip portion; and wherein the solar cell mounting portion of the flexible circuit is bonded to the planar surface of the support panel and the coverglass is bonded to the matrixical arrangement of solar cells.

2. The solar panel module of claim 1, wherein the adherence of each of the solar panels to the flexible circuitry is exclusively by way of the conductive adhesive.

3. The solar panel module of claim 1, wherein the adherence of each of the solar panels to the flexible circuitry is by way of the conductive adhesive and a non-conductive adhesive.

4. The solar panel module of claim 1, wherein the support panel is part of an electrical bus assembly and wherein the elongate connector strip portion extends through or around the electrical bus assembly and has a connector portion on an end of the elongate connector strip portion that is operably attached to the electrical bus assembly.

5. The solar panel module of claim 4, wherein the back side connector is a surface mount adapter attached to the front side of the solar cell and extends around to the back side at a periphery of the solar cell.

6. The solar panel module of claim 1, wherein each bypass diode is integrated onto the flexible circuit with the diode configured as flat and rectangular and is bonded to an electrical connection pad at the top side of the flexible circuit.

7. The solar panel module of claim 6, wherein each bypass diode has a height and is bonded to the base level surface and extends a height above the base level surface and said height is less than or equal to a height of the raised surface of the raised stand-off from the base level surface.

8. The solar panel module of claim 6, wherein the support panel is part of a structural exterior wall of a space vehicle.

9. The solar panel module of claim 1, wherein there are a plurality of blocking diodes that are positioned in a cluster proximate a connector end of the elongate connector strip portion.

10. A flexible circuit for mounting on a panel and for receiving a plurality of solar cells, the flexible circuit comprising a copper circuitry layer sandwiched between at least two polyimide layers, the flexible circuit having a top side with a top surface and a bottom side with a bottom surface, the flexible circuit having an uppermost polyimide layer positioned at said top side providing the top surface, the flexible circuit having a solar cell mounting portion and an elongate connector strip portion extending from the solar cell mounting portion, wherein the copper circuitry layer defining circuitry positioned below the uppermost polyimide layer, the circuitry with copper extending upwardly through the uppermost polyimide layer and providing a plurality of exposed electrical connection pads at a base level surface of the top side of the solar cell mounting portion for electrical connection to the plurality of solar cells, the solar cell mounting portion having ribs at the top side for seating the plurality of solar cells, the ribs formed of polyimide and extending from and unitary with the uppermost polyimide layer, the ribs defining a gap between top side for the mounted solar cells and the base level surface, the base level surface extending between the ribs and the electrical connection pads such that the ribs are spaced from the electrical connection pads at the base level surface, and conductors extending along the elongate connector strip portion;

the solar cell mounting portion of the flexible circuit for bonding to a planar surface of a support panel; and conductive adhesive for disposing on each the plurality of electrical connection pads for electrically connecting the connection pads to the plurality of solar cells.

11. The solar panel module of claim 1, wherein the at least twelve solar cells are each seated on the one or more raised stand-offs at the respective raised surfaces.

12. The solar panel module of claim 11, wherein the one or more raised stand-offs each extend from one of the at least two polyimide layers.

13. A flexible circuit for mounting on a panel and for receiving a plurality of solar cells, the flexible circuit comprising a copper circuitry layer sandwiched between at least two polyimide layers including an uppermost polyimide layer, the flexible circuit having a top side with a top surface and a bottom side with a bottom surface, the flexible circuit having a solar cell mounting portion, wherein the copper circuitry layer defines circuitry, the circuitry having copper extending through the uppermost polyimide layer providing a plurality of exposed electrical connection pads at a base level surface defined at the top surface of the uppermost polyimide layer of the top side of the solar cell mounting portion, the electrical connection pads for electrical connection to the solar cells, the base level surface facing upwardly and being in the same plane as the electrical connection pads, the solar cell mounting portion further having a plurality of stand-offs for seating the plurality of solar cells, the plurality of stand-offs formed of polyimide and projecting upwardly from and being unitary with the uppermost polyimide layer, the plurality of standoffs defining a gap between the seating position of the plurality of solar cells and the base level surface, each of the electrical connection pads exposed on the upwardly facing base level surface and wherein the upwardly facing base level surface extends laterally from each of the electrical connection pads.

* * * * *